(12) United States Patent
Takahashi et al.

(10) Patent No.: US 7,531,232 B2
(45) Date of Patent: *May 12, 2009

(54) COMPONENT FOR VACUUM APPARATUS, PRODUCTION METHOD THEREOF AND APPARATUS USING THE SAME

(75) Inventors: Koyata Takahashi, Sagamihara (JP); Osamu Matsunaga, Sagamihara (JP); Michio Okamoto, Machida (JP)

(73) Assignee: Tosoh Corporation, Yamaguchi (JP)

( * ) Notice: Subject to any disclaimer, the term of this patent is extended or adjusted under 35 U.S.C. 154(b) by 518 days.

This patent is subject to a terminal disclaimer.

(21) Appl. No.: 10/964,893

(22) Filed: Oct. 15, 2004

(65) Prior Publication Data

US 2005/0084654 A1 Apr. 21, 2005

(30) Foreign Application Priority Data

Oct. 17, 2003 (JP) ............... P. 2003-358470
Oct. 31, 2003 (JP) ............... P. 2003-372755

(51) Int. Cl.
*B32B 3/30* (2006.01)
*B32B 5/16* (2006.01)

(52) U.S. Cl. ............ 428/143; 428/144; 428/403; 428/148; 428/149; 427/446; 427/448; 427/452; 427/455; 204/298.12; 204/298.11

(58) Field of Classification Search ........ 428/144, 428/143, 403, 148, 149; 427/446, 448, 452, 427/455; 204/298.12, 298.11
See application file for complete search history.

(56) References Cited

U.S. PATENT DOCUMENTS

| 4,593,007 | A  | * | 6/1986  | Novinski   | 501/105 |
| 6,428,663 | B1 |   | 8/2002  | Mostovoy et al. |    |
| 6,458,445 | B1 | * | 10/2002 | Inaki       | 428/141 |
| 6,777,045 | B2 | * | 8/2004  | Lin et al.  | 428/34.6 |

FOREIGN PATENT DOCUMENTS

| EP | 1352986 A2 * | 10/2003 |
| EP | 1 435 401 A1 | 7/2004 |
| WO | WO 03/083160 A2 | 10/2003 |

OTHER PUBLICATIONS

European Search Report dated Feb. 2, 2005.

* cited by examiner

*Primary Examiner*—William P Watkins, III
(74) *Attorney, Agent, or Firm*—Sughrue Mion, PLLC

(57) ABSTRACT

A component for a vacuum apparatus for use in a plasma processing apparatus or a film forming apparatus for a semiconductor or the like, in which a surface is covered with a ceramic and/or metallic thermal spray film and projection-shaped particles of a width of 10-300 μm, a height of 4-600 μm and an average height/width ratio of 0.4 or higher are present within a range of 20-20,000 particle/mm$^2$ on the surface of the thermal spray film. The thermal spray film has a porosity of 10-40%, shows a high adhering property to a film-shaped substance, is free from a product contamination by particles generated by a peeling of the film-shaped substance and can be continuously used over a prolonged period.

10 Claims, 6 Drawing Sheets

COMPONENT FOR VACUUM APPARATUS, PRODUCTION METHOD THEREOF AND APPARATUS USING THE SAME

FIELD OF THE INVENTION

The present invention relates to a component for a vacuum apparatus to be employed in a film forming apparatus or a plasma processing apparatus (plasma etching apparatus or plasma cleaning apparatus) employed in the manufacture of semiconductor devices or the like. The component for the vacuum apparatus of the present invention prevents particle generation resulting from a peeling of a film-shaped substance sticking to a component in the apparatus at a film forming operation or a plasma processing operation, and also significantly improves a durability of the component to a plasma generated in the apparatus.

BACKGROUND ART

In a film forming apparatus or a plasma processing apparatus for executing a film formation or a plasma processing on a substrate for a product such as a semiconductor device, a film-shaped substance is deposited on a component employed in the interior of such apparatus. It is known, in case the film formation or the plasma processing is conducted continuously in such state, that the deposited film-shaped substance becomes thicker and is eventually peeled to generate particles within the apparatus, thereby contaminating the interior of the apparatus and the substrate for the product. Also a plasma, generated in the interior of the film forming apparatus or the plasma processing apparatus, erodes a surface of the component, thereby causing drawbacks of deterioration of the component and particle generation resulting therefrom. Such phenomena are serious problems as they lead to a deteriorated quality of the product substrate or a deteriorated production yield.

For reducing particle generation by peeling of the film-shaped substance, there is already known a method of applying a blasting process to a component thereby forming a matted surface and increasing the adhering property for the film-shaped substance. For example, it is known to apply a blasting treatment to an internal surface of a quartz bell jar in order to increase the adhering property of particles flying therein and to apply a blasting treatment to a surface of a ceramic cylinder in order to increase the adhering property of a film-shaped substance deposited therein (for example, U.S. Pat. No. 5,460,689). However, a coarse surface formed by blasting the quartz glass includes portions of a low strength or fragments which are split and almost separated, so that the film-shaped substance is difficult to deposit or is easily peeled.

On the other hand, there is also disclosed a method of applying a blasting on quartz glass, and then applying an etching process with a hydrofluoric acid solution (for example, JP-A-8-104541). However, a surface obtained by blasting quartz glass and etching the blasted surface with the hydrofluoric acid solution includes a portion where the film-shaped substance is easily deposited and a portion where the film-shaped substance is not easily deposited, so that the adhering property is insufficient in case of a deposition directly on such surface.

In order to improve the adhering property of the film-shaped substance on the component, it is also known to blast a surface of a quartz material, then to apply an etching process with an acid containing at least hydrofluoric acid and to apply a plasma spraying on thus treated base material with a controlled distance between the base material and a plasma gun (for example, JP-A-2003-212598). However, although such method can achieve a certain improvement on the adhering property of the film-shaped substance, there cannot be expected a sufficient effect capable of withstanding a prolonged use.

In a component of a vacuum apparatus, a technology capable of further improving the adhering property of the film-shaped substance, thereby enabling execution of a film formation or a plasma process in continuous manner over a prolonged period, has always been demanded in the market. Therefore, the invention is to provide an excellent component of a vacuum apparatus for example a film forming apparatus or a plasma processing apparatus for a substrate of a semiconductor device or the like, having a higher adhering property for the film-shaped substance than in the prior technology and enabling a continuous use over a prolonged period.

SUMMARY OF THE INVENTION

As a result of intensive investigations in consideration of the afore-mentioned situation, the present inventors have found that a component for a vacuum apparatus, including a ceramic thermal spray film on a base material and having projection-shaped particles, formed by agglomerates of particles of a diameter of 0.1-5 μm on the thermal spray film, has a better adhering property than in the prior technology to the deposited film-shaped substance and have thus made the present invention (first invention).

The present inventors have also found that a component for a vacuum apparatus, including a metallic thermal spray film on a base material and having projection-shaped particles, formed by agglomerates of particles of a diameter of 0.1-10 μm on the thermal spray film, has a better adhering property than in the prior technology to the deposited film-shaped substance and have thus made the present invention (second invention).

The present inventors have also found that a component for a vacuum apparatus characterized in that a ceramic and/or metallic thermal spray film is formed on a base material, that projection-shaped particles of a width of 10-300 μm, a height of 4-600 μm and an average height/width ratio of 0.4 or higher are present within a range of 20-20,000 particle/mm$^2$ on the surface of the thermal spray film, and that said thermal spray film has a porosity of 10-40%, has a better adhering property to the deposited film-shaped substance than in the prior technology (third invention).

Furthermore, the present inventors have found that such projection-shaped particles can be formed by causing thermal spray powder to collide with the base material, or by forming the thermal spray powder in such a manner that a material of a lower melting point surrounds a material of a higher melting point, and, at the thermal spraying, maintaining the material of a lower melting point in a completely molten state while maintaining the material of a higher melting point is in an unmolten or semi-molten state and causing such thermal spray powder to collide with the base material. In addition, the present inventors have found that particle generation can be prevented in a film forming apparatus, a plasma etching apparatus or a plasma cleaning apparatus utilizing the vacuum apparatus of the invention, whereby the present invention has been completed.

IN THE DRAWINGS

Figure 1:
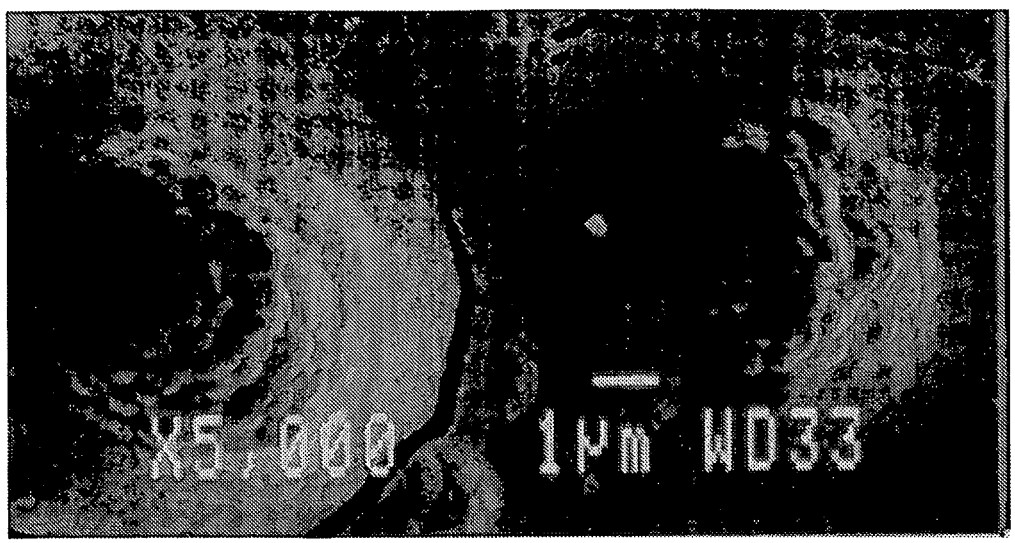
FIG. 1 is a view showing an electron photomicrograph of an example of the projection-shaped particles of the present invention.

20: projection-shaped particle
21: height profile
22: width of projection-shaped particle
23: height of projection-shaped particle
30: base material
31: thermal spray material of a high melting point
32: thermal spray material of a low melting point
33: projection-shaped particle
40: thermal spray gun
41: thermal spray flame
42: thermal spray powder
43: unmolten portion of flying thermal spray particles
44: molten portion of flying thermal spray particles
45: nucleus of a projection-shaped particle formed by an unmolten portion of flying thermal spray particle
46: skin of a projection-shaped particle formed by a molten portion of flying thermal spray particle
50: cathode
51: anode
52: plasma gas (supply pot)
53: thermal spray powder (supply pot)
54: thermal spray distance
55: base material
56: projection-shaped particle layer

DETAILED DESCRIPTION OF THE INVENTION

The present invention is described in detail below.

A first invention relates to a component for a vacuum apparatus comprising a ceramic thermal spray film formed on a base material, wherein projection-shaped particles, formed by agglomerates of particles having a diameter of 0.1-5 µm, are dispersed on the thermal spray film. A diameter of individual particle less than 0.1 µm is undesirable as the projection-shaped particles formed by the agglomerate of the individual particles tends to have a wide distribution, and a diameter of individual particle exceeding 5 µm is undesirable as the projection-shaped particles become difficult to be formed by the agglomeration of the individual particles. Based on these considerations, the preferred particle diameter is within a range of 0.2-4.0 µm.

A second invention relates to a component for a vacuum apparatus comprising a metallic thermal spray film formed on a base material, wherein projection-shaped particles, formed by agglomerates of particles having a diameter of 0.1-10 µm, are dispersed on the thermal spray film. A diameter of individual particle less than 0.1 µm is undesirable as the projection-shaped particles formed by the agglomerate of the individual particles tends to have a wide distribution, and a diameter of individual particle exceeding 10 µm is undesirable as the projection-shaped particles become difficult to be formed by the agglomeration of the individual particles. Based on these considerations, the preferred particle diameter is within a range of 0.2-5.0 µm.

The particle diameter is obtained by taking a certain number of electron photomicrographs of a magnification of several hundred times to several thousand times and calculating an average value on diameters (in a same direction) of 100 particles, and, in this operation, at least 10 projection-shaped particles are selected and an average is calculated by selecting 10 or less particles in such projection-shaped particle.

The projection-shaped particle formed by an agglomerate of the particles preferably has an average diameter of 5-100 µm. An average diameter of the projection-shaped particle less than 5 µm provides an excessively small space for the film-shaped substance to intrude under the projection-shaped particle, thereby deteriorating the adhesion property for the film-shaped substance. Also an average diameter of the projection-shaped particle exceeding 100 µm increases the space for the film-shaped substance to intrude under the projection-shaped particle, but becomes not easy to completely surround the projection-shaped particle thereby generating an unevenness in the deposition of the film-shaped substance and deteriorating the adhesion property therefor. In consideration of the foregoing, the projection-shaped particle more preferably has an average diameter within a range of 10 to 60 µm.

The diameter of the projection-shaped particles is obtained by taking a certain number of electron photomicrographs of a magnification of several ten times to several hundred times and calculating an average value on diameters (in a same direction) of 100 particles.

Then the projection-shaped particles, formed by agglomerates of the particles, is preferably present in a number of 100-20,000 particle/mm$^2$. An average number of the projection-shaped particles less than 100 particle/mm$^2$ reduces the bonding frequency by entanglement of the film-shaped substance and the projection-shaped particle, thereby lowering the adhesion property of the film-shaped substance. In case an average number of the projection-shaped particles is higher than 20,000 particle/mm$^2$, the projection-shaped particles mutually overlap thereby reducing the effect on the adhering property. For achieving a stronger adhering property for the film-shaped substance, based on the afore-mentioned reasons, the projection-shaped particles are more preferably present by 500 to 10,000 particle/mm$^2$.

The number of the projection-shaped particles can be determined, as in the case of size, by taking a certain number of electron photomicrographs of a magnification of several ten times to several hundred times and as an average number by measuring the number of the projection-shaped particles present in plural portions of an arbitrary areas.

Figure 2:
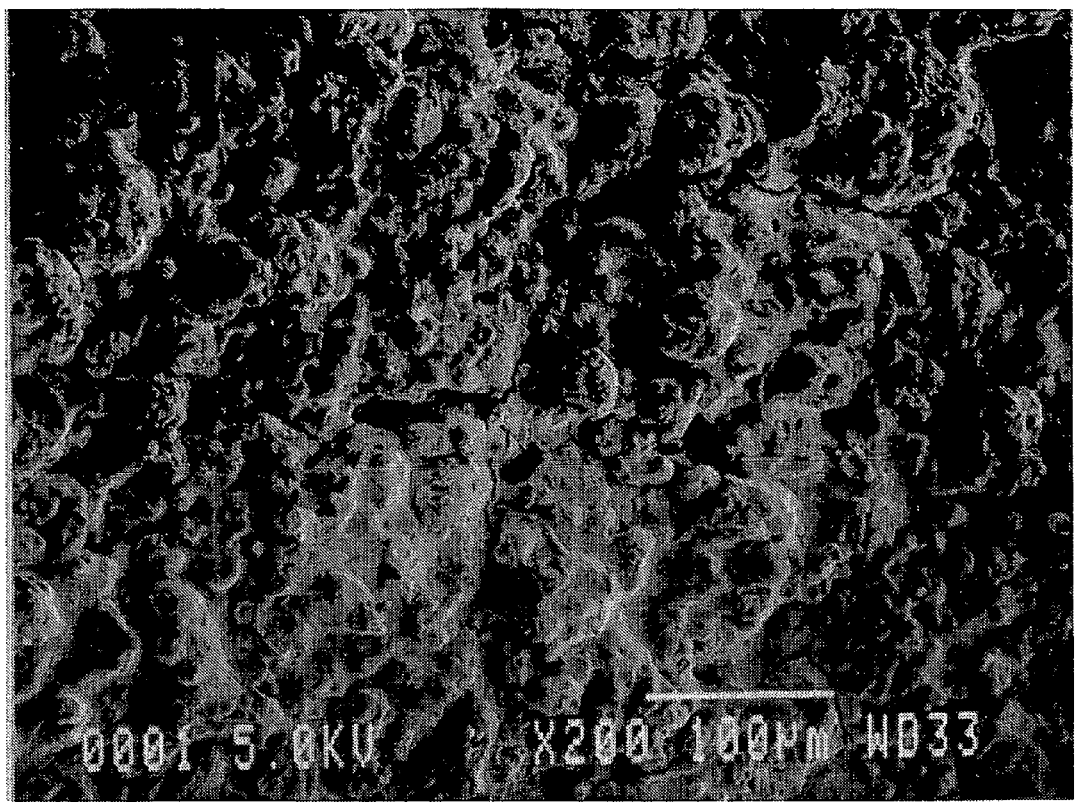
FIG. 2 is a view showing an electron photomicrograph of an example of the projection-shaped particles of the present invention.
Figure 3:
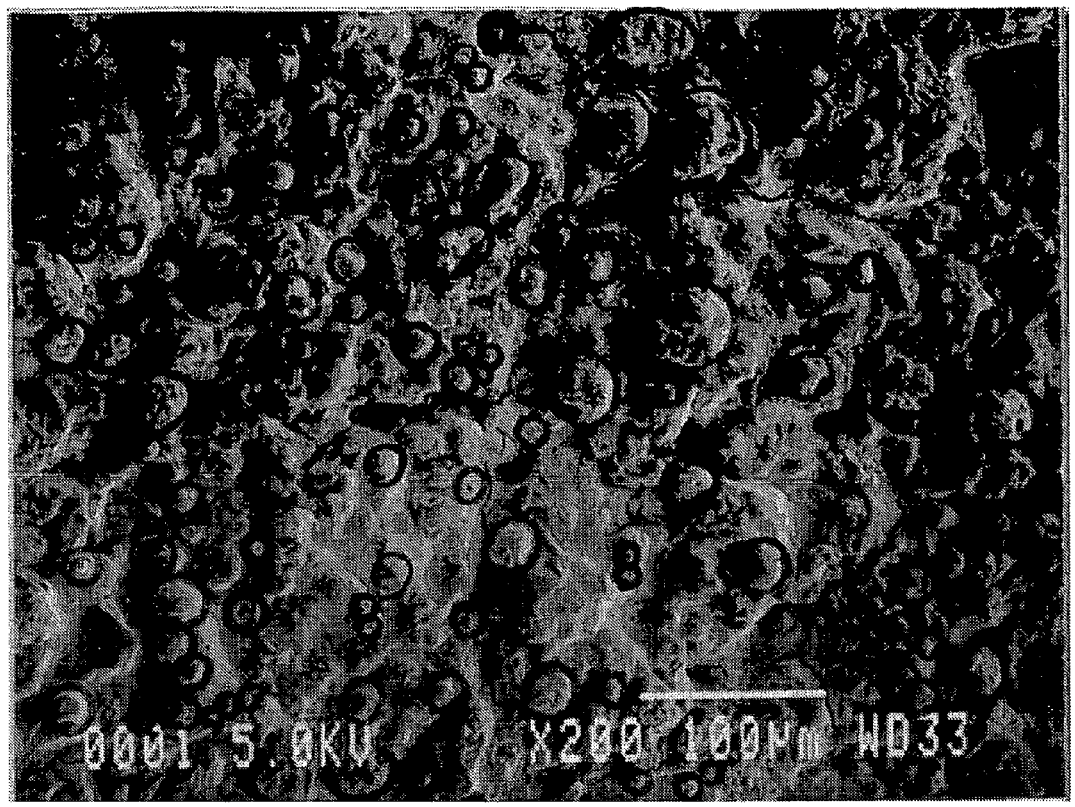
FIG. 3 is a view showing an electron photomicrograph in which the projection-shaped particles in FIG. 2 are marked.

Examples of the projection-shaped particles formed by the agglomerates of particles on a thermal spray film are shown in FIGS. 1, 2 and 3. This thermal spray film is formed by a plasma spraying of zirconia containing yttrium oxide by 5 wt. %. FIG. 1 shows projection-shaped particles formed by agglomeration of particles formed on the thermal spray film, while FIG. 2 shows a state where the projection-shaped particles are further assembled (a state where projection-shaped particles are superposed on other projection-shaped particles), and FIG. 3 shows the projection-shaped particles in FIG. 2, marked with circles. In this manner the number and the diameter of the projection-shaped particles can be obtained by taking photographs of a suitable magnification.

Figure 4:
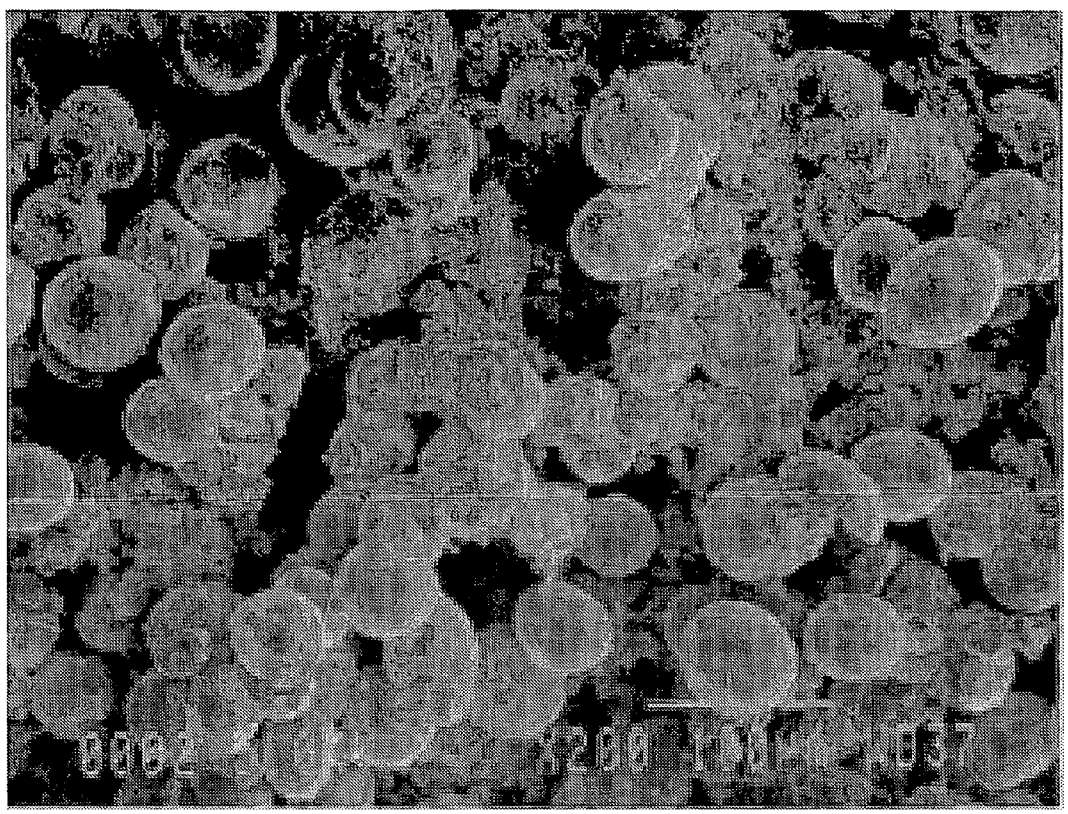
FIG. 4 is a view showing a surface structure of a component obtained in Example 12.

Also an example of the projection-shaped particles formed by the agglomerates of particles on a thermal spray film is shown in FIG. 4. This thermal spray film is formed by a high-speed plasma spraying of aluminum powder. The number and the diameter of the projection-shaped particles can be determined in a similar manner as in the case of the thermal spray film of zirconia containing yttrium oxide.

In the following, a third invention will be described. A component for a vacuum apparatus in the third invention includes a ceramic and/or metallic thermal spray film on a base material, and is characterized in that projection-shaped particles are present on the surface of the thermal spray film.

Figure 5:
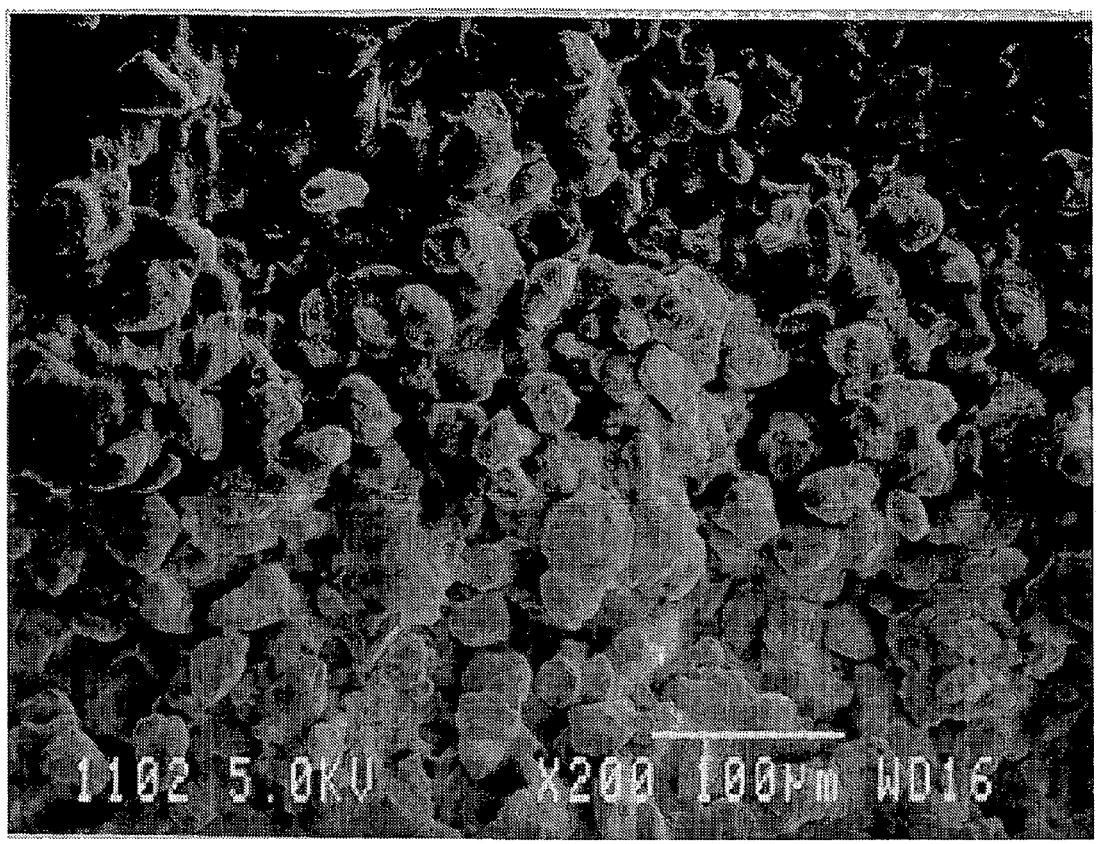
FIG. 5 is a view showing a surface structure of a component obtained in Example 8.

An example of the projection-shaped particles of the third invention is shown in FIG. 5. This thermal spray film is formed by a plasma spraying of aluminum oxide. The projection-shaped particle of the present invention has a mountain-like shape and has rounded corners, and is preferably free from an acute angled portion. This is because an acute-angled projection shape in a plasma processing causes a concentration of an electric field in the plasma on such acute-angled portion which is selectively etched and causes particle generation. In the invention, each such projections may be independent or may be formed by an assembly of certain particles. Preferably, in case of a ceramic thermal spray film, the projection-shaped particle is formed by an agglomerate of particles of a diameter of 0.1-5 μm, and, in case of a metallic thermal spray film, the projection-shaped particle is formed by an agglomerate of particles of a diameter of 0.1-10 μm.

Figure 6:
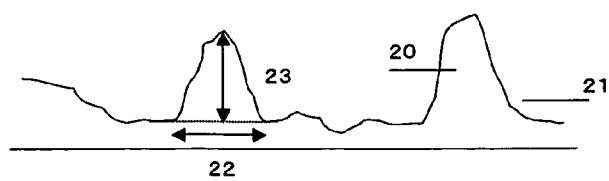
FIG. 6 is a view showing a width and a height of a projection-shaped particle of the present invention.

An example of measurement of a width and a height of a projection-shaped particle in the third invention is shown in FIG. 6. For the measurement, there can be employed an apparatus capable of an image observation and a measurement of width and height at the same time, such as a laser cofocal microscope or a scanning electron microscope. After an observation of an image as shown in FIG. 5, a straight line is drawn so as to pass through a summit of a projection-shaped particle, and a height profile under such straight line is plotted. Then a width of the projection-shaped particle is determined by drawing a background line on thus obtained profile. Also a height is determined by calculating a distance between such line and a summit of the projection. In this manner a width 22 and a height 23 of each projection-shaped particle are calculated, and a height/width ratio is calculated. In the measurement of the projection-shaped particles, the width and the height can be obtained by taking a certain number of electron photomicrographs of a magnification of several ten times to several hundred times and arbitrarily selecting 100 projection-shaped particles.

Now there will be explained a measuring method for a porosity in the third invention. The porosity can be measured by mirror polishing a cross section of the thermal spray film and taking a photograph for example with a scanning electron microscope. In this operation, the cross section of the thermal spray film may be etched in order to clarify grain boundaries and to facilitate the measurement of the porosity. Also in case an abrasive or the like enters the pores, the interior of the pores may be cleaned for example with a chemical reagent. The porosity can be calculated, on a photograph of a magnification of several ten times to several hundred times, by calculated an entire area of the thermal spray film and an area of pores and dividing the pore area by the entire area. In this operation, plural photographs are taken in order to extract 100 pores.

In the third invention, each projection-shaped particle preferably has a width within a range of 10-300 μm, a height within a range of 4-600 μm. A low and flat projection with a width less than 10 μm and a height less than 4 μm reduces the adhering property for the deposited substance. On the other hand, with a width exceeding 300 μm and a height exceeding 600 μm, a pitch of irregularities becomes excessively large, thereby lowering the adhering property for the deposited film and leading to easy particle generation. Based on the foregoing, the size of each projection-shaped particle includes a width within a range of 15-200 μm and a height within a range of 10-400 μm, more preferably a width of 20-100 μm and a height within a range of 15-200 μm.

The height/width ratio of the projection-shaped particle is preferably 0.4 or higher based on the aforementioned size per particle. Also an averaged value of the height/width ratio of the projection-shaped particle is preferably 0.5-2.0. A value less than 0.4 lowers the adhering power because of an excessively flat shape, and a value exceeding 2.0 lowers the adhering power because of an excessively pointed shape. Because of such reasons, the height/width ratio is preferably, in an average value, within a range of 0.8-1.5.

The projection-shaped particles in the third invention are presented in a number per a unit area of 1 $mm^2$ within a range of 20-20,000, particularly preferably 200-10,000 particle/$mm^2$. A number less than 20 particle/$mm^2$ lower the adhering property for the deposited substance, while a number exceeding 20,000 particle/$mm^2$ result in overlapping of the projection-shaped particles thereby resulting in a decrease in the effect of the projections, thereby stimulating particle generation.

The porosity of the thermal spray film is preferably 10-40%. A porosity exceeding 40% results in a weak bonding force of the particles within the thermal spray film, whereby the thermal spray film becomes easier to peel and results in particle generation. On the other hand, at a porosity less than 10%, the thermal spray film becomes less peelable but the projection-shaped particle tends to become flat, whereby the adhering property for the deposited film is lowered. Based on these reasons, the thermal spray film more preferably has a porosity of 15-35%.

In such situation, under the aforementioned thermal spray film, namely between the base material and the thermal spray film having a porosity of 10-40%, there may be formed another thermal spray film different in the porosity. Such intermediate thermal spray film desirably has a porosity lower than that in the aforementioned thermal spray film because the thermal spray film becomes less peelable, preferably equal to or higher than 3% but less than 10%.

In the first, second and third inventions, the thermal spray film is not particularly restricted in the film thickness, but preferably 50-1,000 μm. In a film thickness less than 50 μm, the thermal spray film including the projection-shaped particles may become unable to sufficiently cover irregularities on the base material, and at a film thickness exceeding 1000 μm, the thermal spray film may generate a stress therein and may become easily peelable. Because of these reasons, the film thickness is further preferably 70-500 μm.

In the first, second and third inventions, the thermal spray film may be formed, in a component for a vacuum apparatus for use in an apparatus for film formation, sputtering or plasma processing of a product substrate for a semiconductor device or the like, in a portion where the film-shaped substance may be deposited, so as to cover such portion with the aforementioned film thickness.

In the first, second and third inventions, the base material can be of any material for example glass, a metal such as aluminum, stainless steel or titanium, or a ceramic material such as alumina, zirconia or murite. The projection-shaped particle and the base material may be formed from a same material or from respectively different materials. An undercoat layer may be provided on the base material, in order that the thermally sprayed powder is fused well on the base material to facilitate uniform generation of the projection-shaped particles. The undercoat layer is not particularly restricted in a kind, a material or a thickness, and, for example, can be formed by executing a plasma thermal spray of a material same as that of the base material, or sputtering or electrolytically plating a Ni—Cr alloy or the like.

The metallic or ceramic material constituting the projection-shaped particles of the third invention may be of any material for example a metal such as Al, Ti, Cu, Mo or W, or ceramics such as alumina, zirconia, titania, spinel, or zircon, but a material of a higher melting point facilitates the height/width control in the thermal spray process.

Figure 7:
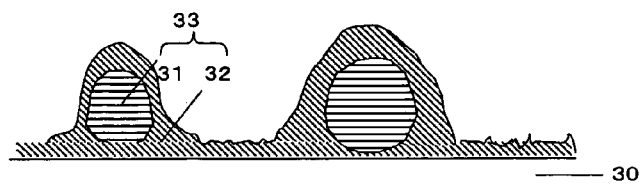
FIG. 7 is a view showing a projection-shaped particle having a structure in which a material of a lower melting point surrounds a material of a higher melting point.

Another component having the projection-shaped particles in the third invention has a structure in which a material of a lower melting point surrounds a material of a higher melting point thereby forming a mountain-like structure. FIG. 7 is a schematic view of such structure. On a base material 30, a projection-shaped particle of a structure in which a material 32 of a lower melting point surrounds a material 31 of a higher melting point is formed. The material 32 of the lower melting point and the material 31 of the higher melting point preferably have a difference in the melting points preferably of 400° C. or larger, more preferably 1,000° C. or larger.

Such structure allows to control the height of the projection-shaped particle 33 by the height of the material 31 of the higher melting point, thereby forming the projection-shaped particle more reproducibly. Examples of a combination of the material of the lower melting point and the material of the higher melting point include, in case of metals, Al and Mo, and Cu and W, and, in case of ceramics, alumina and zirconia, and cordierite and alumina. It is also possible to combine a metal and a ceramic material, such as Al and boron nitride, or Co and tungsten carbide.

In the following, there will be explained a method for producing a component for a vacuum apparatus of the first invention.

In a raw material powder to be used as a ceramic thermal spray material for generating particles of a diameter of 0.1-5 μm, a sintering for suppressing grain growth may be added. Presence of the sintering aid allows to suppress an abnormal grain growth in the projection-shaped particle of the thermal spray film, and also to similarly suppress an abnormal grain growth in the projection-shaped particle formed by an agglomerate of spherical particles, thereby obtaining a thermal spray film having a uniform texture.

As the sintering aid, there can be employed without limitation a known sintering aid for the ceramics employed as the raw material powder. For example, in case of employing zirconia as the raw material powder, magnesium oxide, yttrium oxide or cerium oxide may be added as the sintering aid in an amount of 1-20 wt. %, and, in case of employing alumina as the raw material powder, magnesium oxide may be added in an amount of 0.05-10 wt. %.

For forming the ceramic thermal spray film of the first invention, it is preferable to employ a raw material of a high purity. It is particularly preferable to employ a high purity material of 99 wt. % or higher, further 99.9 wt. % or higher. The raw material powder for thermal spraying may be produced for example by an electric melting-crushing method or a granulation method, and there may also be employed a spherical powder formed by sintering granules to a relative density of 80% or higher.

Also the raw material powder preferably has an average primary particle size of 0.1-3 μm, more preferably 0.2-2 μm. The raw material powder having such primary particle size improves uniformity of secondary particles constituted by agglomeration, thereby enabling formation of the projection-shaped particles of the invention formed by the agglomerate of the particles. Because of the aforementioned reasons, the secondary particles preferably have an average particle size of 5-100 μm, more preferably 10-60 μm.

The thermal spray method is not particularly restricted, and may be selected from a flame spraying, an arc spraying, a detonation spraying and a plasma spraying. For example a plasma spraying is selected, it is usually conducted in argon gas, but hydrogen may be added to the argon gas. A hydrogen addition allows to elevate the temperature of the plasma flame, particularly allows to suppress a loss in the plasma temperature in a front end portion. The hydrogen addition is preferably executed within a range of 10-50 vol. %, particularly 20-40 vol. %.

In case of forming a ceramic thermal spray film by a plasma spraying, the thermal spray film is preferably produced by executing the thermal spraying at a distance between the base material and a plasma spray gun within a range of 60-130 mm. In case the distance between the plasma gun and the base material for the ceramic thermal spray film is less than 60 mm, the projection-shaped particles constituting the factor of the invention are difficult to obtain as the plasma sprayed particles are re-fused on the base material. On the other hand, at a distance exceeding 130 mm, the projection-shaped particles assume an excessively molten state, thereby reducing the adhesion of the thermal spray film to the base material and eventually reducing the adhesive property of the film-shaped substance.

The ceramic thermal spray film, after the formation thereof, may be heat treated at 1,000-1,600° C. A heat treatment at 1,000° C. or higher reduces crystal defects in the ceramic thermal spray film, and improves an acid resistance of the ceramic thermal spray film. An improved acid resistance of the ceramic thermal spray film avoids dissolution of the ceramic thermal spray film itself when the component for the vacuum apparatus, after use in a film forming apparatus or a plasma processing apparatus, is subjected to a removal of a film-shaped substance on the component by an acid etching, whereby the component can be used plural times. Such heat treatment becomes effective because, for example in case the ceramic thermal spray film is constituted of alumina, a heat treatment at 1,000° C. or above reduces a content of y-alumina in the thermal spray film. Also in a material other than alumina, a similar effect can be obtained by a decrease in the crystal lattice defects. On the other hand, a heat treatment temperature exceeding 1,600° C. is undesirable for example because of a cracking in the component. The heat treatment is conducted for a period within a range of several minutes to about 10 hours, preferably 30 minutes to 3 hours, and is preferably executed in the air or in an oxygen atmosphere.

In the following, there will be explained a method for producing a component for a vacuum apparatus of the second invention.

A raw material powder to be used as a metallic thermal spray material for generating particles of a diameter of 0.1-10 μm is not particularly restricted and can be a powder of a pure metal or an alloy, and an auxiliary agent for suppressing grain growth is preferably added. Presence of such auxiliary agent allows to suppress an abnormal grain growth in the projection-shaped particle of the thermal spray film, and also to similarly suppress an abnormal grain growth in the projection-shaped particle formed by an agglomerate of spherical particles, thereby obtaining a thermal spray film having a uniform texture.

As the auxiliary agent, any auxiliary agent can be employed without limitation to the metal employed as the raw material powder. For example, in case of employing aluminum as the raw material powder, silicon, copper, titanium, nickel or iron may be employed as the auxiliary agent in an amount of 1-50 wt. %.

For forming the metal thermal spray film of the invention, it is preferable to employ a raw material of a high purity. It is particularly preferable to employ a high purity material of 99 wt. % or higher, further 99.9 wt. % or higher. The raw material powder for thermal spraying may be produced for example by an atomizing method, an electric melting-crushing method or a granulation method.

Also the raw material powder preferably has an average primary particle size of 0.1-10 µm, more preferably 0.2-5 µm. The raw material powder having such primary particle size improves uniformity of secondary particles constituted by agglomeration, thereby enabling formation of the projection-shaped particles of the invention formed by the agglomerate of the particles. Because of the aforementioned reasons, the secondary particles preferably have an average particle size of 5-120 µm, more preferably 10-100 µm.

The thermal spray method is not particularly restricted, and may be selected from a flame spraying, an arc spraying, a detonation spraying and a plasma spraying. For example a plasma spraying is selected, it is preferably executed with higher velocity as possible and lower flame temperature as possible. A film formation in such manner allows to slightly melt a peripheral portion only of the metal powder, thereby causing a plastic deformation when the metal powder reaches the base material and achieving an efficient film formation.

In the following, there will be explained a method for producing a component for a vacuum apparatus of the third invention.

At the thermal spraying, a mountain-shaped projection-shaped particle can be producing by causing the thermal spray powder in a semi-molten state to collide with the base material. There can be employed for example a plasma spraying method or a high velocity flame spraying method during thermal spraying, the thermal spray powder is brought to a semi-molten state, in which, as shown in FIG. 7, the powder is in an unmolten state (43) in the vicinity of the center and in a molten state (44) in the peripheral portion by regulating a thermal spraying power, a thermal spraying distance, a flame strength of a high velocity flame spraying. In case of employing a ceramic powder as the thermal spray powder, it is possible to cause the thermal spray powder to reach the base material in a semi-molten state by employing a plasma spraying method with a reduced spraying power. In case of employing a metal powder as the thermal spray powder, it is possible by a similar method to cause the thermal spray powder to reach the base material in a semi-molten state, but there is preferably employed a plasma spraying method or a high velocity flame spraying method of a high gas flow rate. In this manner it is possible to cause the particles in a semi-molten state to collide with the base material, thereby causing a plastic deformation and obtaining a film of a satisfactory adhesion. In order to form a surface projection with a satisfactory adhesion and a high height/width ratio by rendering the peripheral portion alone of the thermal spray powder easily fusible in a uniform manner, the thermal spray powder preferably has a spherical shape, and an atomized powder can be employed for this purpose.

Another component having the projection-shaped particles in the invention can be produced by forming a thermal spray powder which a material of a lower melting point surrounds a material of a higher melting point, and by causing the powder to collide with the base material at the thermal spraying in such a state where the material of the lower melting point is completely molten while the material of the higher melting point is in an unmolten or semi-molten state.

In the present invention, in order to form a thermal spray film having projection-shaped particles of a sufficient amount on the base material, the thermal spraying is preferably executed twice or more.

Also a thermal spray condition for obtaining a semi-molten state of the powder or for obtaining a completely molten state in the material of the lower melting point and a unmolten or semi-molten state in the material of the higher melting point is variable depending on the thermal spray powder to be employed and is difficult to define uniquely, but can be easily determined by those skilled in the art by repeating a thermal spraying test plural times.

An average particle size (secondary particle size) of the thermal spray powder to be employed in the preparation of the projection-shaped particles is preferably 5-100 µm, more preferably 10-60 µm. At an average particle size less than 5 µm, it is difficult to uniformly introduce the raw material into the flame because the raw material powder itself lacks a sufficient fluidity. On the other hand, an average particle size exceeding 100 µm tends to result in an uneven melting of the thermal spray particles, thus deteriorating the adhesion of the obtained projection-shaped particles to the base material. The particles employed for the thermal spraying preferably have an as uniform particle size as possible in order to obtain a uniform shape in the projection-shaped particles and to increase the adhering property for the deposited film.

A component for a vacuum apparatus of the first, second or third invention, obtained by the aforementioned methods, may be, after the formation of the thermal spray film, subjected to an ultrasonic rinsing with ultra purified water or the like and then dried. Prior to the last ultrasonic rinsing, the component for the vacuum apparatus may be immersed in a weak acid such as nitric acid for cleaning the surface of the thermal spray film.

The present invention further proposes a film forming apparatus utilizing the aforementioned component for the vacuum apparatus. The film forming apparatus of the invention is not restricted in a film forming method, which includes a CVD (chemical vapor deposition) method and a sputtering method. The component for the vacuum apparatus is preferably used as a component in a portion where a film-shaped substance is deposited, other than a product substrate subjected to film formation in such apparatus. For example it can be used as a bell jar or a shield. Particularly in a CVD film forming apparatus for tungsten or titanium or in a sputtering apparatus for titanium nitride, the component for the vacuum apparatus of the invention, employed as a bell jar or a shield, is free from a cracking or a peeling resulting from a difference in the thermal expansion coefficients between the base material and the projection-shaped particles and is free from particle generation by a peeling of the deposited film-shaped substance, thereby providing an apparatus enabling a continuous film formation over a prolonged period.

Also the present invention further proposes a plasma etching apparatus and a plasma cleaning apparatus utilizing the aforementioned component for the vacuum apparatus. The component for the vacuum apparatus is preferably used as a component in a portion where a film-shaped substance is deposited in such apparatus, or a portion where a surface of the component tends to be peeled off in contact with the plasma, for example as an annular clamp or a shield.

The plasma etching apparatus or the plasma cleaning apparatus means an apparatus in which a product placed therein is irradiated with plasma, thereby etching off or cleaning a surface of the product.

The portion where a film-shaped substance is deposited means a portion, at the plasma irradiation onto the product in the plasma etching apparatus thereby etching the surface of the product, where a etched substance is scattered and deposited in the apparatus. In the invention, a portion etched by plasma means a portion etched by a contact with the plasma, other than the product in the apparatus. Such apparatus is designed to irradiate a product with plasma to etch a surface of such product, but it is difficult to selectively irradiate the product only with such plasma, which comes into contact with a component of the apparatus in the vicinity of the product therein, thereby etching the surface of such component. The component of the invention, when employed in such portion, is difficult to be etched by the plasma, thereby suppressing particle generation.

Then, in the plasma cleaning apparatus, a portion where a film is deposited means a portion, at an inverse sputtering or a product surface cleaning by irradiating a product with plasma in the plasma cleaning apparatus, where a substance eliminated by such cleaning is scattered and deposited in the apparatus. The plasma cleaning apparatus and the plasma etching apparatus are based on a same etching principle of the product surface with plasma. An inverse sputtered portion in the plasma cleaning in the invention means a portion other than the product, subjected to inverse sputtering (cleaning by etching) in contact with the plasma. Such apparatus is originally designed to irradiate a product with plasma to clean a surface of such product, but it is difficult to selectively irradiate the product only with such plasma, which comes also into contact with a component of the apparatus in the vicinity of the product therein, thereby cleaning the surface of such component.

The present invention also proposes a sputtering target bearing a thermal spray film constituted of the aforementioned projection-shaped particles. In this manner, when sputtered particles are scattered onto the target or the backing plate, the sputtered particles (re-deposition powder) causing particles can be efficiently deposited on the thermal spray film. The material constituting the thermal spray film is not particularly restricted, but is preferably constituted of a material same as that for the target, in order to prevent contamination in the sputtering apparatus.

In the sputtering target, the thermal spray film of the invention is preferably formed in a non-sputtered portion (non-erosion portion) on the surface of the target. In such case, the thermal spray film of the invention may be formed on the entire non-erosion portion or a part thereof, depending upon an amount of generation of the re-deposition powder. In case the re-deposition powder is generated not only on the target but also on the backing plate, the thermal spray film of the invention may be formed also on the surface of such backing plate. In case of forming a thermal spray film on the backing plate, the material constituting the thermal spray film is not particularly restricted, but can be a powder of copper, aluminum or titanium on a backing plate of oxygen-free copper. Furthermore, in case the re-deposition powder is generated on a lateral face portion of the target or the backing plate, the thermal spray film of the invention may be provided, depending on the amount of generation thereof, also on such lateral face portion.

The component for the vacuum apparatus of the present invention, showing an excellent adhering property for the film-shaped substance in comparison with a prior component, can prevent a contamination of the product resulting from peeling of the film-shaped substance at the use in a film forming apparatus or a pre-cleaning apparatus, and also allows a continuous use over a prolonged period.

The present invention is described in more detail by reference to the following Examples, but it should be understood that the present invention is not construed as being limited thereto.

EXAMPLE 1

An interior of a quartz bell jar was blasted with white alumina Grit WA#60 under a pressure of 0.5 MPa, then ultrasonic rinsed with pure water and dried in an oven. Then the internal surface of the quartz bell jar was subjected to a formation of a zirconia thermal spray film by a plasma thermal spraying with an Ar:$H_2$ flow rate ratio of 80:20 and a charged electric power of 35 kW. As the raw material powder, there was employed stabilized zirconia powder (average primary particle size: 0.2 μm, average particle size: 50 μm, purity: 99.9%) added by yttrium oxide (purity: 99.9 wt. %) by 5 wt. %. A plasma gun and the quartz bell jar were maintained at a distance of 70 mm. After the thermal spraying, it was immersed for 1 hour in a 5 wt. % aqueous solution of nitric acid maintained at 40° C., then ultrasonic rinsed with ultra pure water and dried in a clean oven to obtain a quartz bell jar bearing a ceramic thermal spray film of partially stabilized zirconia.

A zirconia thermal spray film was prepared on a 5 inch-square quartz base material under same conditions as those for the quartz bell jar. A sample was cut out from the base material and was subjected to a SEM observation of a surface, to confirm presence of projection-shaped particles constituted of fine spherical particles within a range of 0.2-4.0 μm. 100 projection-shaped particles arbitrarily extracted from a SEM photograph of a magnification of 200 times provided an average size of 20 μm. Also a number of the projection-shaped particles measured from 10 photographs of a magnification of 200 times was 950 particle/$mm^2$ in average.

The quartz bell jar prepared by the aforementioned method was used by mounting in a pre-cleaning apparatus. No particles resulting from the peeling of a film-shaped substance were collected in the apparatus even after 220 hours from the start of use.

EXAMPLE 2

A quartz bell jar product and a 5 inch-square zirconia thermal spray film were prepared under the conditions same as those in Example 1, except that the distance between the plasma gun and the quartz bell jar was changed to 120 mm. A sample was cut out from the base material and was subjected to a SEM observation of a surface, to confirm presence of projection-shaped particles constituted of fine spherical particles within a range of 0.2-3.6 μm. 100 projection-shaped particles arbitrarily extracted from a SEM photograph of a magnification of 200 times provided an average size of 32 μm. Also a number of the projection-shaped particles measured from 10 photographs of a magnification of 200 times was 400 particle/$mm^2$ in average.

The quartz bell jar prepared by the aforementioned method was used by mounting in a pre-cleaning apparatus. No particles resulting from the peeling of a film-shaped substance were collected in the apparatus even after 220 hours from the start of use.

EXAMPLE 3

An interior of a quartz bell jar was blasted with white alumina Grit WA#60 under a pressure of 0.5 MPa, then ultrasonic rinsed with pure water and dried in an oven. Then the internal surface of the quartz bell jar was subjected to a formation of an alumina thermal spray film by a plasma spraying with an $Ar:H_2$ flow rate ratio of 75:25, a distance of 65 mm between a plasma gun and the quartz glass base material, and a charged electric power of 35 kW. For the plasma spraying, there was employed alumina granulate powder (average primary particle size: 0.5 μm, average particle size: 25 μm, purity: 99.9%) added with magnesia (purity: 99.9 wt. %) by 1 wt. %. After the thermal spraying, it was ultrasonic rinsed with ultra pure water and dried in a clean oven to obtain a quartz bell jar.

A magnesia-added alumina thermal spray film was prepared on a 5 inch-square quartz base material under same conditions as those for the quartz bell jar. A sample was cut out from the base material and was subjected to a SEM observation of a surface, to confirm presence of projection-shaped particles constituted of fine spherical particles within a range of 0.5-3.5 μm. 100 projection-shaped particles arbitrarily extracted from a SEM photograph of a magnification of 150 times provided an average size of 16 μm. Also a number of the projection-shaped particles measured from 10 photographs of a magnification of 150 times was 1080 particle/$mm^2$ in average.

The quartz bell jar prepared by the aforementioned method was used by mounting in a CVD film forming apparatus. No particles resulting from the peeling of a film-shaped substance were collected in the apparatus even after 150 hours from the start of use.

EXAMPLE 4

A quartz bell jar product and a 5 inch-square zirconia thermal spray film were prepared under the conditions same as those in Example 3, except that the distance between the plasma gun and the quartz bell jar was changed to 125 mm. A sample was cut out from the base material and was subjected to a SEM observation of a surface, to confirm presence of projection-shaped particles constituted of fine spherical particles within a range of 0.5 to 3.9 μm. 100 projection-shaped particles arbitrarily extracted from a SEM photograph of a magnification of 150 times provided an average size of 22 μm. Also a number of the projection-shaped particles measured from 10 photographs of a magnification of 150 times was 860 particle/$mm^2$ in average.

The quartz bell jar prepared by the aforementioned method was used by mounting in a CVD film forming apparatus. No particles resulting from the peeling of a film-shaped substance were collected in the apparatus even after 180 hours from the start of use.

EXAMPLE 5

An internal surface of a donut-shaped ring was blasted with white alumina Grit WA#60 under a pressure of 0.5 MPa, then ultrasonic rinsed with pure water and dried in an oven. Then the internal surface of the donut-shaped ring was subjected to a formation of an yttria thermal spray film by a plasma spraying with $N_2$ gas as a plasma gas, a distance of 75 mm between a plasma gun and the stainless steel base material, and a charged electric power of 40 kW. As the raw material powder, there was employed yttria powder (average primary particle size: 0.3 μm, average particle size: 35 μm) of a purity of 99.9% containing 15 wt. % of lanthanum oxide granular powder of a purity: 99.9 wt. % (average primary particle size: 0.3 μm, average particle size: 30 μm). After the thermal spraying, it was ultrasonic rinsed with ultra pure water and dried in a clean oven to obtain a sputtering shield having a ceramic thermal spray film constituted of yttria-lanthanum oxide.

A yttria-lanthanum oxide thermal spray film was prepared on a 5 inch-square quartz stainless steel base material under same conditions as those for the sputtering shield. A sample was cut out from the base material and was subjected to a SEM observation of a surface, to confirm presence of projection-shaped particles constituted of fine spherical particles within a range of 0.3-3.2 μm. 100 projection-shaped particles arbitrarily extracted from a SEM photograph of a magnification of 100 times provided an average size of 12 μm. Also a number of the projection-shaped particles measured from 10 photographs of a magnification of 100 times was 2200 particle/$mm^2$ in average.

The sputtering shield prepared by the aforementioned method was used by mounting in a sputtering apparatus. No particles resulting from the peeling of a film-shaped substance were collected in the apparatus even after 140 hours from the start of use.

EXAMPLE 6

A shield product and a 5 inch-square yttria-lanthanum oxide thermal spray film were prepared under the conditions same as those in Example 5, except that the distance between the plasma gun and the quartz bell jar was changed to 115 mm. A sample was cut out from the base material and was subjected to a SEM observation of a surface, to confirm presence of projection-shaped particles constituted of fine spherical particles within a range of 0.3-3.4 μm. 100 projection-shaped particles arbitrarily extracted from a SEM photograph of a magnification of 100 times provided an average size of 14 μm. Also a number of the projection-shaped particles measured from 10 photographs of a magnification of 100 times was 1600 particle/$mm^2$ in average.

The shield prepared by the aforementioned method was used by mounting in a sputtering apparatus. No particles resulting from the peeling of a film-shaped substance were collected in the apparatus even after 160 hours from the start of use.

EXAMPLE 7

A shield product and a 5 inch-square yttria-lanthanum oxide thermal spray film were prepared under the conditions same as those in Example 5, except that the distance between the plasma gun and the donut-shaped ring was changed to 180 mm. A sample was cut out from the base material and was subjected to a SEM observation of a surface, to confirm presence of projection-shaped particles constituted of fine spherical particles within a range of 0.3-4.8 μm. 100 projection-shaped particles arbitrarily extracted from a SEM photograph of a magnification of 100 times provided an average size of 25 μm. Also a number of the projection-shaped particles measured from 10 photographs of a magnification of 100 times was 300 particle/$mm^2$ in average.

The shield prepared by the aforementioned method was used by mounting in a sputtering apparatus. After 100 hours from the start of use, a film-shaped substance in the apparatus was observed in a state that it is going to peel.

COMPATATIVE EXAMPLE 1

An interior of a quartz bell jar was blasted with white alumina Grit WA#60 under a pressure of 0.5 MPa, then ultrasonic rinsed with pure water and dried in an oven. Then the internal surface of the quartz bell jar was subjected to a formation of an alumina thermal spray film by a plasma thermal spraying with an $Ar:H_2$ flow rate ratio of 70:30 and a charged electric power of 40 kW. As the raw material powder, there was employed alumina granular powder of a purity of 99.9% (average primary particle size: 0.5 μm, average particle size: 45 μm). A plasma gun and the quartz bell jar were maintained at a distance of 150 mm. After the thermal spraying, it was ultrasonic rinsed with ultra pure water and dried in a clean oven to obtain a quartz bell jar bearing a high purity alumina thermal spray film.

An alumina thermal spray film was prepared on a 5 inch-square quartz base material under same conditions as those for the quartz bell jar. A sample was cut out from the base material and was subjected to a SEM observation of a surface. The surface of the thermal spray film was formed by well molten splats and projection-shaped particles constituted of fine spherical particles of 5.0 μm or less were not observed.

The quartz bell jar prepared by the aforementioned method was used by mounting in a pre-cleaning apparatus. After 70 hours from the start of use, particles resulting from the peeling of a film-shaped substance were observed in the apparatus.

COMPATATIVE EXAMPLE 2

The quartz bell jar prepared in a method similar to that in Comparative Example 1 was used by mounting in a CVD film forming apparatus. After 70 hours from the start of use, particles resulting from the peeling of a film-shaped substance were collected in the apparatus.

EXAMPLE 8

Figure 8:
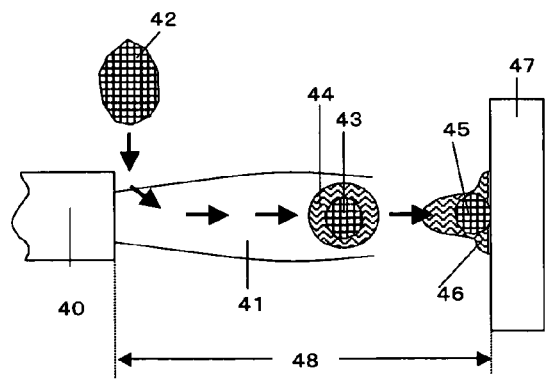
FIG. 8 is a view showing a method for producing a component for a vacuum apparatus, constituted of projection-shaped particles of the present invention.
Figure 9:
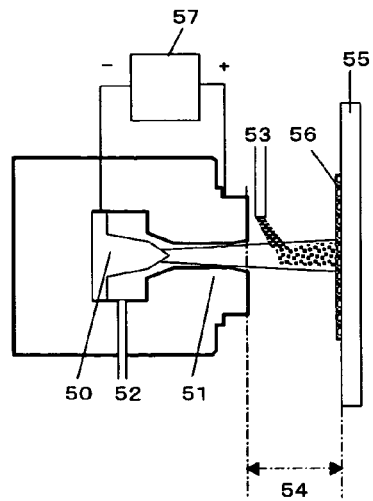
FIG. 9 is a view showing a method for producing a component for a vacuum apparatus, constituted of projection-shaped particles of the present invention, by plasma spraying.

A plasma thermal spray apparatus as shown in FIG. 8 was employed with an argon:hydrogen flow ratio of 80:20 as a plasma gas 51, a thermal spray distance 54 of 100 mm, a thermal spray gun moved with a speed of 600 mm/sec and a pitch of 5 mm, and a supply amount of 20 g/min for alumina of an average particle size of 40 μm to execute thermal spraying twice with a power of 25 kW to form a surface layer having projection-shaped particles on a quartz base material.

The base material subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 100 μm and showed presence of mountain-shaped projection-shaped particles, on the surface layer. The electron photomicrograph of the surface layer is shown in FIG. 5.

A measurement on 100 arbitrarily extracted projection-shaped particles provided a width of 10-70 μm, a height of 5-100 μm, and an average height/width ratio of 1.2 per projection, and a number of projections was 1000 projection/$mm^2$.

A porosity measurement conducted by mirror finishing a cross section of the thermal spray film and taking an electron photomicrograph proved a porosity of 25%. An observation under a polarizing microscope on a polished cross section of the projection-shaped particles showed a nucleus-like part in most projection-shaped particles, thus confirming that the thermal spray powder was thermally sprayed in a state where it was molten in a peripheral portion and remained unmolten in a central portion.

COMPATATIVE EXAMPLE 3

A surface layer was formed by a thermal spraying under conditions same as those in Example 8, except that the thermal spray power was changed to 35 kW. The base material subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 120 μm and showed presence of mountain-shaped projection-shaped particles on the surface layer. A measurement on 100 arbitrarily extracted projection-shaped particles provided a width of 20-200 μm, and a height of 4-100 μm per projection, and, within the 100 projection-shaped particles, there were observed flat particles with a height/width ratio of 0.3. A porosity measurement conducted by mirror finishing a cross section of the thermal spray film and taking an electron photomicrograph proved a porosity of 3%. An observation under a polarizing microscope on a polished cross section of the flat particles confirmed that the particle was molten to the central portion.

EXAMPLE 9

A sample was formed under conditions same as those in Example 8, except that the thermal spray power was changed to 30 kW and that alumina powder with an average particle size of 60 μm was employed. The base material subjected to the thermal spraying was cut out into a size allowing a microscope observation, and after an ultrasonic rinsing and drying, subjected to an observation of a surface and a cross section of the thermal spray film under a laser cofocal microscope. The thermal spray film had a thickness of 120 μm and showed presence of mountain-shaped projection-shaped particles on the surface layer. A measurement on 100 arbitrarily extracted projection-shaped particles provided a width of 15-100 μm, a height of 5-85 μm and an average height/width ratio of 0.9 per projection, and a number of projections was 730 projection/$mm^2$. A porosity measurement conducted by mirror finishing a cross section of the thermal spray film and taking an electron photomicrograph proved a porosity of 18%. An observation under a polarizing microscope on a polished cross section of the projection-shaped particles showed a nucleus-like part in most projection-shaped particles, thus confirming that the thermal spray powder was thermally sprayed in a state where it was molten in a peripheral portion and remained unmolten in a central portion.

EXAMPLE 10

A sample was formed under same conditions as those in Example 8, except that the thermal spray power was changed to 32 kW and that alumina powder with an average particle size of 50 μm was employed. A thermal spray film was then prepared on thus prepared thermal spray film under same conditions as those in Example 8, except that the thermal spray power was changed to 20 kW and that alumina powder with an average particle size of 25 μm was employed. The base material subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 200 μm and showed presence of mountain-shaped projection-shaped particles, constituted of agglomerates of fine spherical particles of 0.6 to 3.6 μm, on the surface layer. A measurement on 100 arbitrarily extracted projection-shaped particles provided a width of 10-65 μm, a height of 6-120 μm and an average height/width ratio of 1.6 per projection, and a number of projections was 1300 projection/mm². A porosity measurement conducted by mirror finishing a cross section of the thermal spray film and taking an electron photomicrograph proved a porosity of 32% for the upper layer, and 8% for the under layer. An observation under a polarizing microscope on a polished cross section of the projection-shaped particles showed a nucleus-like part in most projection-shaped particles, thus confirming that the thermal spray powder was thermally sprayed in a state where it was molten in a peripheral portion and remained unmolten in a central portion.

EXAMPLE 11

A plasma thermal spray apparatus as shown in FIG. 8 was employed with an argon: hydrogen flow ratio of 75:25 as a plasma gas 51, a thermal spray distance 54 of 100 mm, a thermal spray gun moved with a speed of 500 mm/sec and a pitch of 5 mm, and a supply amount of 15 g/min for a spherical copper powder of an average particle size of 30 μm to execute thermal spraying twice with a power of 20 kW to form a surface layer having projection-shaped particles on a stainless steel base material.

The base material subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 100 μm and showed presence of mountain-shaped projection-shaped particles on the surface layer. A measurement on 100 arbitrarily extracted projection-shaped particles provided a width of 15-65 μm, a height of 10-95 μm, and an average height/width ratio of 1.3 per projection, and a number of projections was 1,250 projection/mm². An observation under a polarizing microscope on a polished cross section of the projection-shaped particles showed a nucleus-like part in most projection-shaped particles, thus confirming that the thermal spray powder was thermally sprayed in a state where it was molten in a peripheral portion and remained unmolten in a central portion.

EXAMPLE 12

A plasma thermal spray apparatus as shown in FIG. 8 was employed with a gas flow rate of 80 SLM which is twice of that in Example 8. There were employed an argon:hydrogen flow ratio of 90:10 as a plasma gas 51, a thermal spray distance 54 of 100 mm, a thermal spray gun moved with a speed of 1,000 mm/sec and a pitch of 5 mm, and a supply amount of 10 g/min for a spherical aluminum powder of an average particle size of 65 μm to execute thermal spraying twice with a power of 70 kW to form a surface layer having projection-shaped particles on a stainless steel base material.

The base material subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 150 μm and showed presence of mountain-shaped projection-shaped particles, constituted of agglomerates of fine spherical particles within a range of 2-9 μm, on the surface layer. An electron photomicrograph of the surface layer is shown in FIG. 4. A measurement on 100 arbitrarily extracted projection-shaped particles provided a width of 20-80 μm, a height of 25-150 μm, and an average height/width ratio of 1.8 per projection, and a number of projections was 320 projection/mm². A porosity measurement conducted by mirror finishing a cross section of the thermal spray film and taking an electron photomicrograph proved a porosity of 30%. An observation under a polarizing microscope on a polished cross section of the projection-shaped particles showed a nucleus-like part in most projection-shaped particles, thus confirming that the thermal spray powder was thermally sprayed in a state where it was slightly molten in a peripheral portion and remained unmolten in a central portion.

COMPARATIVE EXAMPLE 4

A surface layer was formed by a thermal spraying under conditions same as those in Example 11, except that the thermal spray power was changed to 35 kW. The base material subjected to the thermal spraying was cut out into a size allowing a microscope observation, and, after an ultrasonic rinsing and drying, subjected to an observation of a surface and a cross section of the thermal spray film. The thermal spray film had a thickness of 110 μm and showed presence of mountain-shaped projection-shaped particles on the surface layer. A measurement on 100 arbitrarily extracted projection-shaped particles provided a width of 15-180 μm, and a height of 3-70 μm per projection, and, within the 100 projection-shaped particles, there were observed flat particles with a height/width ratio of 0.2. A porosity measurement conducted by mirror finishing a cross section of the thermal spray film and taking an electron photomicrograph proved a porosity of 8%. An observation under a polarizing microscope on a polished cross section of the flat particles confirmed that the particle was molten to the central portion.

EXAMPLE 13

A plasma thermal spray apparatus as shown in FIG. 8 was employed with an argon:hydrogen flow ratio of 90:10 as a plasma gas 51, a thermal spray distance 54 of 80 mm, a thermal spray gun moved with a speed of 400 mm/sec and a pitch of 5 mm, and a supply amount of 15 g/min for a powder formed by coating a stabilized zirconia powder of an average particle size of 35 μm with an alumina powder of an average particle size of 30 μm in a 1:1 ratio, to execute thermal spraying twice with a power of 25 kW to form a surface layer having projection-shaped particles.

The base material subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 130 μm and showed presence of mountain-shaped projection-shaped particles on the surface layer. A measurement on 100 arbitrarily extracted projection-shaped particles provided a width of 10-90 μm, a height of 10-130 μm, and an average height/width ratio of 1.2 per projection, and a number of projections was 1,350 projection/mm². A porosity measurement conducted by mirror finishing a cross section of the thermal spray film and taking an electron photomicrograph proved a porosity of 20%. An observation under a polarizing microscope on a polished cross section of the projection-shaped particles showed a nucleus-like part in most projection-shaped particles, thus confirming that the thermal spray powder was thermally sprayed in a state where the alumina powder present in a peripheral portion of the thermal spray powder was molten while the zirconia powder present in a central portion of the thermal spray powder remained unmolten.

EXAMPLE 14

In order to evaluate an adhering property of the sample for a deposited substance, a silicon nitride film was directly deposited on the samples of Examples 8 to 13 and Comparative Examples 3 to 4. After evacuation to $5 \times 10^{-5}$ Pa, a silicon nitride film of a thickness of 100 μm was formed at the room temperature, employing a silicon target and introducing a mixture of argon gas and nitrogen gas up to a pressure of 0.3 Pa. After the film formation, the environment was returned to the air, and, after standing for 1 day, each sample was heated for 1 hour at 600° C. and subjected to an inspection under a microscope after the sample returned to the room temperature. Peeling or particle generation was not observed at all in the samples of Examples 8-13, but the samples of Comparative Examples 3-4 showed a peeling.

EXAMPLE 15

Quartz bell jars prepared by the methods of Examples 8 to 9 and Comparative Example 3 were used by mounting on a CVD film forming apparatus. In shields prepared by the methods of Examples 8 to 9, particles resulted from the peeling of the film-shaped substance were not collected in the apparatus even after 160 hours from the start of use, but, in a shield prepared by the method of Comparative Example 3, particles by the peeling of the film-shaped substance were observed after 70 hours from the start of use.

EXAMPLE 16

Shields prepared by the methods of Examples 10 to 13 and Comparative Example 4 were used by mounting on a sputtering film forming apparatus. In shields prepared by the methods of Examples 10 to 13, particles resulted from the peeling of the film-shaped substance were not collected in the apparatus even after 150 hours from the start of use, but, in a shield prepared by the method of Comparative Example 4, particles by the peeling of the film-shaped substance were observed after 60 hours from the start of use.

EXAMPLE 17

A plasma thermal spray apparatus as shown in FIG. 8 was employed with an argon:hydrogen flow ratio of 95:5 as a plasma gas 51, a thermal spray distance 54 of 120 mm, a thermal spray gun moved with a speed of 400 mm/sec and a pitch of 5 mm, and a powder supply amount of 20 g/min for an ITO powder (indium oxide-tin oxide by 10 wt. %) with an average particle size of 30 μm, to execute thermal spraying twice with a power of 25 kW on an ITO target (tin oxide: 10 wt. %) to form a surface layer having projection-shaped particles. In this operation, an erosion portion on the surface of the ITO target was so masked as to avoid thermal spraying, and the ITO thermal spray film was formed only in a non-erosion portion.

The target subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 130 μm and showed presence of mountain-shaped projection-shaped particles on the surface layer. A measurement on 100 arbitrarily extracted projection-shaped particles provided a width of 10-140 μm, a height of 8-120 μm, and an average height/width ratio of 0.9 per projection, and a number of projections was 1300 projection/mm$^2$. A porosity measurement conducted by mirror finishing a cross section of the thermal spray film and taking an electron photomicrograph proved a porosity of 24%. An observation under a polarizing microscope on a polished cross section of the projection-shaped particles showed a nucleus-like part in most projection-shaped particles, thus confirming that the thermal spray powder was thermally sprayed in a state where a peripheral portion of the thermal spray powder was molten while a central portion remained unmolten.

EXAMPLE 18

A plasma thermal spray apparatus as shown in FIG. 8 was employed with a gas flow rate of 70 SLM as a plasma gas 51, an argon: hydrogen flow ratio of 90:10 a thermal spray distance 54 of 125 mm, a thermal spray gun moved with a speed of 300 mm/sec and a pitch of 3 mm, and a powder supply amount of 15 g/min for a spherical chromium powder of an average particle size of 15 μm, to execute thermal spraying twice with a power of 80 kW on a chromium target to form a surface layer having projection-shaped particles. In this operation, an erosion portion on the surface of the chromium target was so masked as to avoid thermal spraying, and the chromium thermal spray film was formed only in a non-erosion portion.

The target subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 150 μm and showed presence of mountain-shaped projection-shaped particles, constituted of agglomerates of fine spherical particles within a range of 0.8-6.7 μm, on the surface layer. A measurement on 100 arbitrarily extracted projection-shaped particles provided a width of 12-130 μm, a height of 10-140 μm, and an average height/width ratio of 1.1 per projection, and a number of projections was 800 projection/mm$^2$. A porosity measurement conducted by mirror finishing a cross section of the thermal spray film and taking an electron photomicrograph proved a porosity of 22%. An observation under a polarizing microscope on a polished cross section of the projection-shaped particles showed a nucleus-like part in most projection-shaped particles, thus confirming that the thermal spray powder was thermally sprayed in a state where a peripheral portion of the thermal spray powder was molten while a central portion remained unmolten.

EXAMPLE 19

A plasma thermal spray apparatus as shown in FIG. 8 was employed with a gas flow rate of 90 SLM as a plasma gas 51, an argon: hydrogen flow ratio of 92:8, a thermal spray distance 54 of 100 mm, a thermal spray gun moved with a speed of 450 mm/sec and a pitch of 3.5 mm, and a powder supply amount of 8 g/min for a spherical aluminum powder with an average particle size of 70 µm, to execute thermal spraying four times with a power of 70 kW on an aluminum target to form a surface layer having projection-shaped particles. In this operation, an erosion portion on the surface of the aluminum target was so masked as to avoid thermal spraying, and the aluminum thermal spray film was formed only in a non-erosion portion.

Then thermal spraying was conducted four times on a surface and a lateral face of a backing plate of an oxygen-free copper, under same conditions as those for the aluminum powder except for employing a copper-aluminum mixed powder of an average particle size of 55 µm, thereby forming a surface layer having projection-shaped particles.

The target subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 180 µm and showed presence of mountain-shaped projection-shaped particles, constituted of agglomerates of fine spherical particles within a range of 2.5 to 10 µm, on the surface layer. A measurement on 100 arbitrarily extracted projection-shaped particles provided a width of 25 to 200 µm, a height of 16 to 130 µm, and an average height/width ratio of 0.8 per projection, and a number of projections was 280 projection/mm$^2$. A porosity measurement conducted by mirror finishing a cross section of the thermal spray film and taking an electron photomicrograph proved a porosity of 12%. An observation under a polarizing microscope on a polished cross section of the projection-shaped particles showed a nucleus-like part in most projection-shaped particles, thus confirming that the thermal spray powder was thermally sprayed in a state where a peripheral portion of the thermal spray powder was molten while a central portion remained umolten.

EXAMPLE 20

A high velocity spray apparatus capable of a high velocity spraying was employed with propane gas of a pressure of 0.7 MPa as a fuel gas, oxygen gas of a pressure of 1.0 MPa as a combustion gas, a thermal spray distance of 140 mm, a thermal spray gun moved with a speed of 500 mm/sec and a pitch of 5 mm, and a powder supply amount of 10 g/min for a spherical aluminum powder with an average particle size of 60 µm, to execute thermal spraying four times on a surface and a lateral face of an aluminum target and a backing plate to form a surface layer having projection-shaped particles. In this operation, an erosion portion on the surface of the aluminum target was so masked as to avoid thermal spraying, and the aluminum thermal spray film was formed only in a non-erosion portion.

The target subjected to the thermal spraying was cut out into a size allowing a microscope observation, and, after an ultrasonic rinsing and drying, subjected to an observation of a surface and a cross section of the thermal spray film under a laser cofocal microscope. The thermal spray film had a thickness of 200 µm and showed presence of mountain-shaped projection-shaped particles, constituted of agglomerates of fine spherical particles within a range of 1.4-5.0 µm, on the surface layer. A measurement on 100 arbitrarily extracted projection-shaped particles provided a width of 20-180 µm, a height of 25-240 µm, and an average height/width ratio of 1.6 per projection, and a number of projections was 480 projection/mm$^2$. A porosity measurement conducted by mirror finishing a cross section of the thermal spray film and taking an electron photomicrograph proved a porosity of 20%. An observation under a polarizing microscope on a polished cross section of the projection-shaped particles showed a nucleus-like part in most projection-shaped particles, thus confirming that the thermal spray powder was thermally sprayed in a state where a peripheral portion of the thermal spray powder was slightly molten while a central portion remained unmolten.

EXAMPLE 21

Targets prepared in Examples 17-20 were used by mounting in a sputtering film forming apparatus. In an observation of the target surface after 100 hours from the start of use, re-deposited powder was firmly deposited on the target surface, at such level that the powder was hardly peeled with bare hands.

COMPARATIVE EXAMPLE 5

An ITO target prepared in the same manner as in Example 17, except that the ITO powder was not thermally sprayed on the ITO target surface, was used by mounting in a sputtering film forming apparatus in the same manner as in Example 21. In an observation of the target surface after 50 hours from the start of use, re-deposited powder was peeled from a non-erosion portion of the target, and the re-deposited powder was scattered around the erosion portion of the target.

It should further be apparent to those skilled in the art that various changes in form and detail of the invention as shown and described above may be made. It is intended that such changes be included within the spirit and scope of the claims appended hereto.

This application is based on Japanese Patent Application No. 2003-358470 filed Oct. 17, 2003 and Japanese Patent Application No. 2003-372755 filed Oct. 31, 2003, the disclosures of which are incorporated herein by reference in its entirety.

What is claimed is:

1. A component for a vacuum apparatus comprising a ceramic and/or metallic thermal spray film formed on a base material, wherein projection-shaped particles of a width of 10-300 µm, a height of 4-600 µm and an average height/width ratio of 0.4 or higher are present within a range of 20-20,000 particle/mm$^2$ on the surface of said thermal spray film, and the projection-shaped particles have a mountain-like shape and have rounded corners, in the case of the ceramic thermal spray film, the projection-shaped particle is formed by an agglomerate of particles of a diameter of 0.1-5 µm, and in the case of the metallic thermal spray film, the projection-shaped particle is formed by an agglomerate of particles of a diameter of 0.1-10 µm.

2. A component for a vacuum apparatus according to claim 1, wherein another thermal spray film different from said thermal spray film and having a porosity of 3-10% is formed between the base material and said thermal spray film.

3. A component for a vacuum apparatus according to claim 1, wherein the projection-shaped particles have an average height/width ratio from 0.5 to 2.0.

4. A component for a vacuum apparatus according to claim 1, wherein the projection-shaped particle has a central portion remaining unmolten.

5. A component for a vacuum apparatus according to claim 1, wherein that the projection-shaped particle comprises materials of different melting points, and is formed in such a manner that a material of a lower melting point surrounds a material of a higher melting point.

6. A method for producing a component for a vacuum apparatus as claimed in claim 1, comprising colliding a thermal spray powder comprising a ceramic and/or metallic material in a semi-molten state with a base material to form, on a surface thereof, a thermal spray film containing projection-shaped particles having a width of 10-300 μm, a height of 4-600 μm and an average height/width ratio of 0.4 or higher within a range of 20-20,000 particle/mm² on the surface of said thermal spray film.

7. A method for producing a component for a vacuum apparatus as claimed in claim 5, comprising forming a ceramic and/or metallic thermal spray powder in such a manner that a material of a lower melting point surrounds a material of a higher melting point, and colliding the powder with the base material at the thermal spraying in such a state that the material of the lower melting point is completely molten while the material of the higher melting point is in an unmolten or semi-molten state to form, on a surface thereof, a thermal spray film containing projection-shaped particles of a width of 10-300 μm, a height of 4-600 μm and an average height/width ratio of 0.4 or higher within a range of 20-20,000 particle/mm².

8. A sputtering target obtained by forming a ceramic and/or metallic thermal spray film on a non-erosion portion of a sputtering target material which is a component for a vacuum apparatus, wherein said thermal spray film containing projection-shaped particles of a width of 10-300 μm, a height of 4-600 μm and an average height/width ratio of 0.4 or higher within a range of 20-20,000 particle/mm², and the projection-shaped particles have a mountain-like shape and have rounded corners, in the case of the ceramic thermal spray film, the projection-shaped particle is formed by an agglomerate of particles of a diameter of 0.1-5 μm, and in the case of the metallic thermal spray film, the projection-shaped particle is formed by an agglomerate of particles of a diameter of 0.1-10 μm.

9. A sputtering target according to claim 8, wherein a target material is bonded to a backing plate.

10. A sputtering target according to claim 9, wherein the non-erosion portion of the sputtering target is at least one portion selected from a non-erosion portion of the target material, a surface portion and a lateral portion of the backing plate.

* * * * *